(12) United States Patent
Lee

(10) Patent No.: US 7,839,459 B2
(45) Date of Patent: Nov. 23, 2010

(54) FLAT PANEL DISPLAY DEVICE INCLUDING ELECTROSTATIC DISCHARGE PREVENTION UNITS

(75) Inventor: Keun-Soo Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1102 days.

(21) Appl. No.: 11/280,515

(22) Filed: Nov. 15, 2005

(65) Prior Publication Data

US 2006/0103772 A1    May 18, 2006

(30) Foreign Application Priority Data

Nov. 15, 2004    (KR)    .................. 10-2004-0093286

(51) Int. Cl.
*G02F 1/1333*    (2006.01)

(52) U.S. Cl. ........................................ 349/40

(58) Field of Classification Search .............. 349/40
See application file for complete search history.

(56) References Cited

U.S. PATENT DOCUMENTS

| | | | |
|---|---|---|---|
| 6,587,160 B2 * | 7/2003 | Lee et al. ...................... | 349/40 |
| 2002/0104995 A1 * | 8/2002 | Yamazaki et al. .............. | 257/72 |
| 2005/0078232 A1 * | 4/2005 | Lo et al. ....................... | 349/40 |

FOREIGN PATENT DOCUMENTS

| | | |
|---|---|---|
| CN | 1529197 A | 9/2004 |
| JP | 08-234227 A | 9/1996 |
| JP | 2001-092371 A | 4/2001 |
| JP | 2002-134756 A | 5/2002 |
| JP | 2003-140189 A | 5/2003 |
| JP | 2004-134453 A | 4/2004 |
| KR | 2002-0056695 | 7/2002 |

OTHER PUBLICATIONS

Korean Patent Abstracts, Publication No. 1020020056695 A, dated Jul. 10, 2002, in the name of Jong Yeop Jun et al.
Chinese Office Action, with English translation, dated Nov. 16, 2007, for corresponding CN application No. 2005101246279, indicating the relevance of US 2002/0104995 A1 and CN 1529197 A, both cited in an IDS dated May 16, 2008.

* cited by examiner

*Primary Examiner*—David Nelms
*Assistant Examiner*—Nathanael R Briggs
(74) *Attorney, Agent, or Firm*—Christie, Parker & Hale, LLP

(57) ABSTRACT

A flat panel display device includes a plurality of data lines spaced apart from each other on a substrate, power supply lines, and scan lines crossing the data lines and supply lines. First and second thin film transistors are each formed on the substrate and include a semiconductor layer, a gate insulation film, a gate electrode, a source electrode, and a drain electrode. At least one capacitor has a first electrode and a second electrode, and the first electrode is connected to the source or drain electrode of the first or second thin film transistor. An organic layer includes at least a light-emitting layer coupled to the second thin film transistor. An electrostatic discharge prevention unit is installed at an end the plurality of scan lines.

12 Claims, 8 Drawing Sheets

FLAT PANEL DISPLAY DEVICE INCLUDING ELECTROSTATIC DISCHARGE PREVENTION UNITS

CROSS REFERENCE

This application claims priority to and the benefit of Korean Patent Application No. 10-2004-0093286, filed on Nov. 15, 2004, the disclosure of which is hereby incorporated herein by reference in its entirety.

BACKGROUND OF THE INVENTION

1. Field of the Invention

The present invention relates to a flat panel display device and a fabrication method thereof and, more particularly, to a flat panel display device comprising an electrostatic discharge protection unit capable of discharging static electricity generated in the flat panel display device without damaging a thin film transistor (TFT), and a method of fabricating the flat panel display device.

2. Description of Related Art

A cathode-ray tube (CRT) is a commonly used display device, which is mainly used in monitors, televisions, measuring instruments, information terminals, etc. However, a CRT is not capable of actively coping with requirements for leaner and lighter electronic products due to its weight and size.

A flat panel display device having the merits of a small size and light weight has attracted attention for replacing the CRT. Types of flat panel display devices include liquid crystal displays (LCD), organic light-emitting displays (OLED), etc.

A flat panel display device includes a substrate on which a thin film transistor (TFT) is formed, and red, green, and blue light-emitting diodes.

The foregoing flat panel display device is formed mainly through a TFT array process of forming a TFT for applying signals to pixel units, a process of forming red, green and blue light-emitting diodes for materialization of colors, and a process of cutting the TFT substrate into cells of unit flat panel display devices.

The process of cutting the TFT substrate into cells of the unit flat panel display devices includes a process of scribing cutting lines on the TFT substrate after forming the light-emitting diodes thereon, and a process of cutting the TFT substrate along the cutting lines by applying force to the cutting lines.

The flat panel display device is typically fabricated on an insulation substrate such as a glass substrate, and the insulation substrate is very weak to static electricity since it is a nonconductor. The insulation substrate is a nonconductor in order to prevent an electric charge from generating instantaneously and discharging to the lower side of the substrate. Therefore, an insulation film, TFT or light-emitting diodes formed on the insulation substrate can be damaged by static electricity.

In this case, the substrate may become partially degraded since static electricity has characteristics of very high voltage and very low electric charge amount. Furthermore, static electricity is generated mainly in a cell cutting process of cutting the substrate. Most of the static electricity flows in through a pad part of gate lines and data lines, and degrades the channels of the TFT.

Typically, a shorting bar is installed at a region surrounding a pixel region to prevent static electricity from degrading the TFT after static electricity flows in from the outside as described in the above.

Low temperature polycrystalline silicon having a superior crystalline structure is commonly used as a semiconductor layer of a TFT. However, the low temperature polycrystalline silicon has a characteristic in which morphology is deteriorated on grain boundaries. FIG. 1 is a photograph showing a portion A of a gate electrode of a TFT where low temperature polycrystalline silicon 10 is partially projected. As shown, the gate insulation film 20 is damaged because its thickness at the projected portion is thin, and static electricity is discharged from this thin portion when static electricity is generated.

FIG. 2 is a photograph showing a TFT damaged by static electricity. A portion B is defective where wires largely overlap due to generation of static electricity. In addition to this portion, a plurality of defects due to static electricity are generated on other portions on which an electric field is concentrated due to bent wirings.

FIG. 3A is a schematic plan view illustrating a conventional organic electroluminescence display device. FIG. 3B is another schematic plan view illustrating a part of an ordinary organic electroluminescence display device. FIG. 3C is a photograph showing a floating scan line installed from the left side to the right side. Scan signals going through scan lines shown in FIGS. 3A-3C are applied to the left side and completed at the right side, and parts C of the scan lines where the scan signals end are floating.

FIG. 4 is a drawing illustrating a defect map of an organic electroluminescence display device according to prior art and showing that defects due to static electricity are mainly generated on the right sides of the scan lines where scan signals of FIG. 3A end. Static electricity is discharged to the floating end parts C of the scan lines to which an electric field is concentrated or to a weak part of the device. This static electricity results in defects of the device. The static electricity is generated at a starting point of the scan lines and is transmitted to the opposite side of the starting point inside the organic electroluminescence display device.

The foregoing flat panel display device according to the prior art has problems of lower reliability and lower yield of the device, including damage of TFT caused by static electricity, since a protection unit for handling electrostatic discharge is not applied to the inside of a pixel region of a small flat panel display device. This is because a static electricity circuit occupies a large area although a shorting bar is formed on a region surrounding the pixel region to prevent the device from being damaged by static electricity flowing in from the outside.

SUMMARY OF THE INVENTION

Therefore, various embodiments of the invention provide a flat panel display device for preventing a device in a pixel region from being damaged by forming an electrostatic discharge unit capable of preventing static electricity on end parts of scan lines inside the pixel region.

In one embodiment, a flat panel display device includes at least one data line spaced from each other on a substrate, power supply lines, and scan lines crossing the data lines and supply lines. First and second thin film transistors are each formed on the substrate and include a semiconductor layer, a gate insulation film, a gate electrode, a source electrode, and a drain electrode. At least one capacitor has a first electrode and a second electrode, and the first electrode is connected to the source or drain electrode of the first or second thin film transistor. An organic layer includes at least a light-emitting layer coupled to the second thin film transistor. An electrostatic discharge prevention unit is installed at an end the plurality of scan lines.

Two cusps of the electrostatic discharge prevention unit may be in contact with each other, or overlapped or spaced apart from each other by approximately 0.2 μm. The width of a part where cusps of the electrostatic discharge prevention unit cross each other may be thinner than the gate insulation film of the first or second thin film transistor.

An embodiment of a method of fabricating a flat panel display device according to the invention, includes forming a semiconductor layer pattern on an upper part of a substrate, a gate insulation film over the substrate, and a gate electrode material on an upper part of the gate insulation film. The method also includes etching the gate electrode material through photolithography to form gate electrodes of thin film transistors, scan lines connected to the gate electrodes, and an electrostatic discharge prevention unit on one end of the scan lines. The method also includes forming source/drain electrodes connected to the semiconductor layer pattern, a first electrode connected to one of the source/drain electrodes, an organic layer including at least a light-emitting layer, and a second electrode.

BRIEF DESCRIPTION OF THE DRAWINGS

The above and other features and aspects of the present invention will become more apparent to those of ordinary skill in the art by describing in detail examples of embodiments thereof with reference to the attached drawings in which.

DETAILED DESCRIPTION

Figure 1:
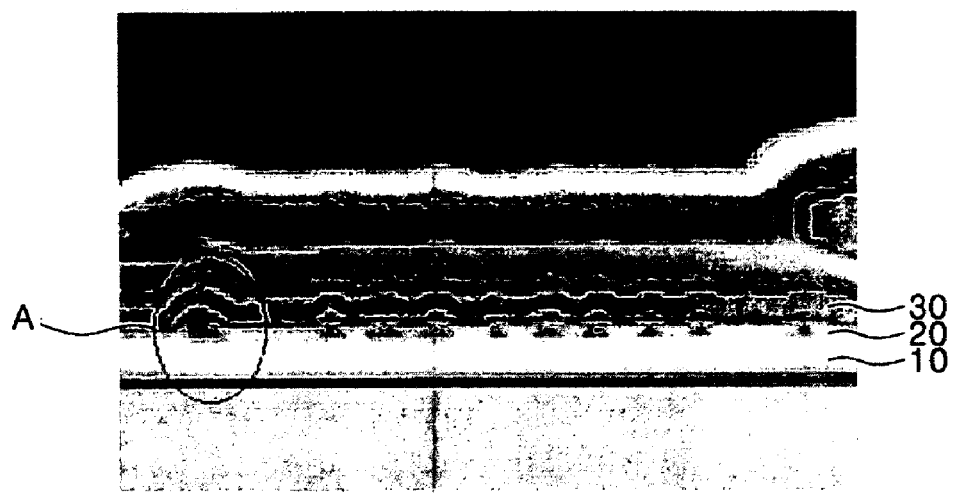
FIG. 1 is a photograph showing a gate electrode portion of a TFT.
Figure 2:
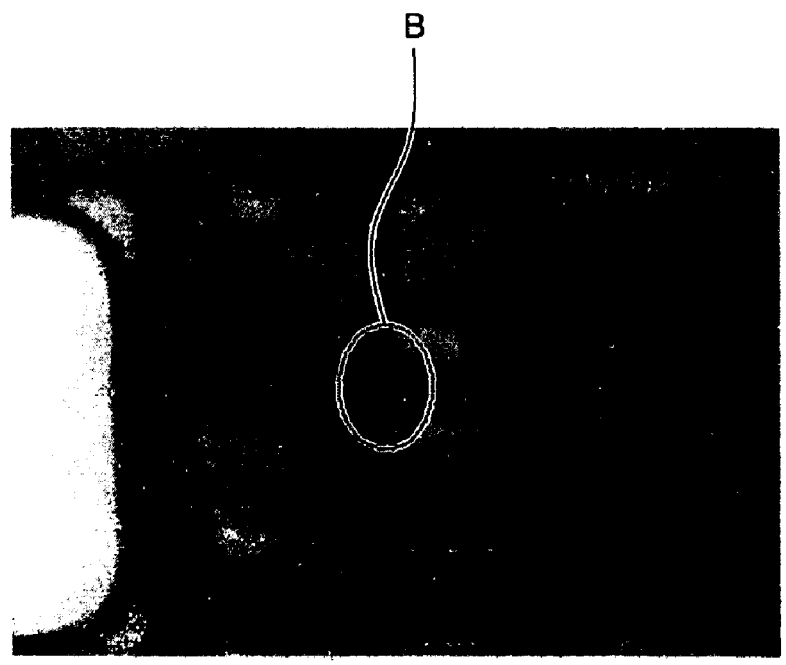
FIG. 2 is a photograph of TFT damaged by static electricity.
Figure 3A:
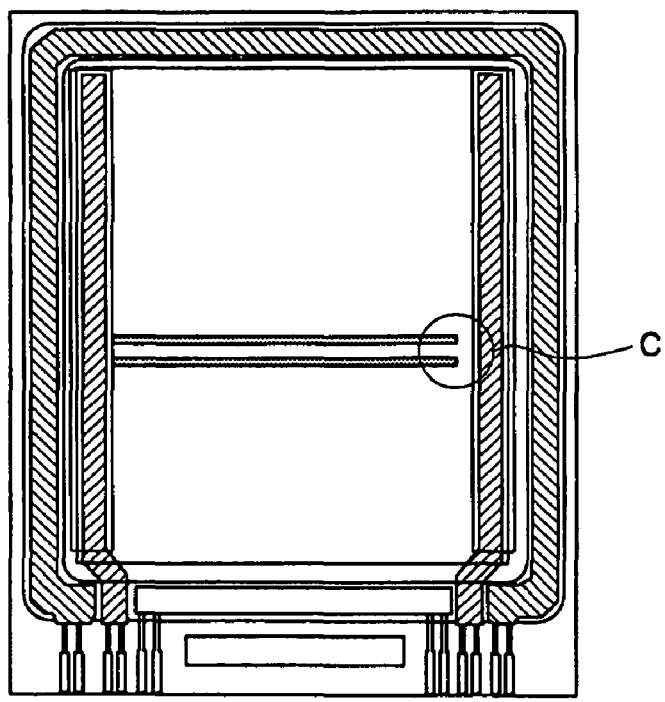
FIG. 3A is a schematic plan view illustrating a conventional organic electroluminescence display device.
Figure 3B:
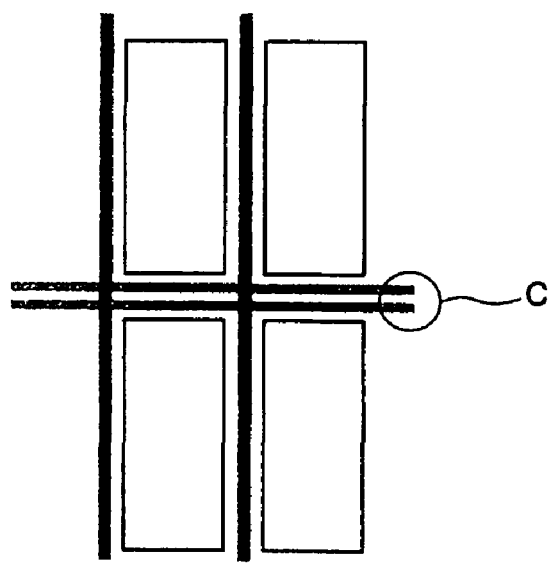
FIG. 3B is a schematic plan view illustrating a portion of an organic electroluminescence display device.
Figure 3C:
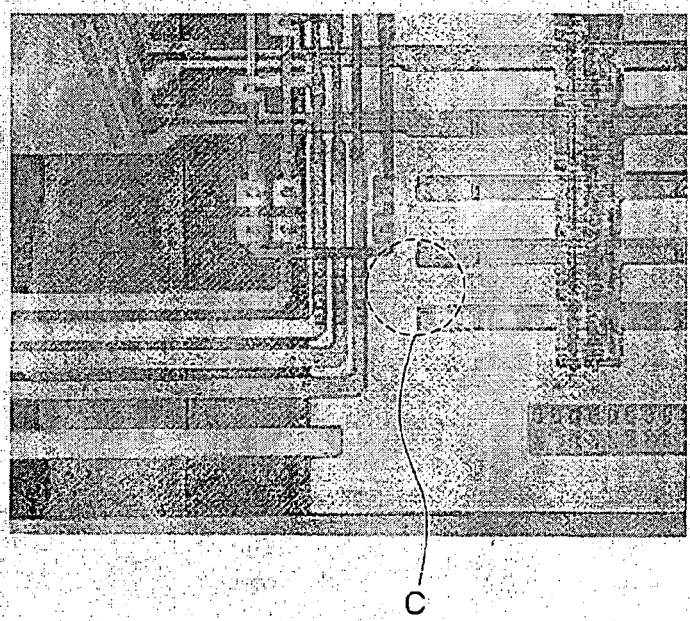
FIG. 3C is a photograph showing a floating scan line.
Figure 4:
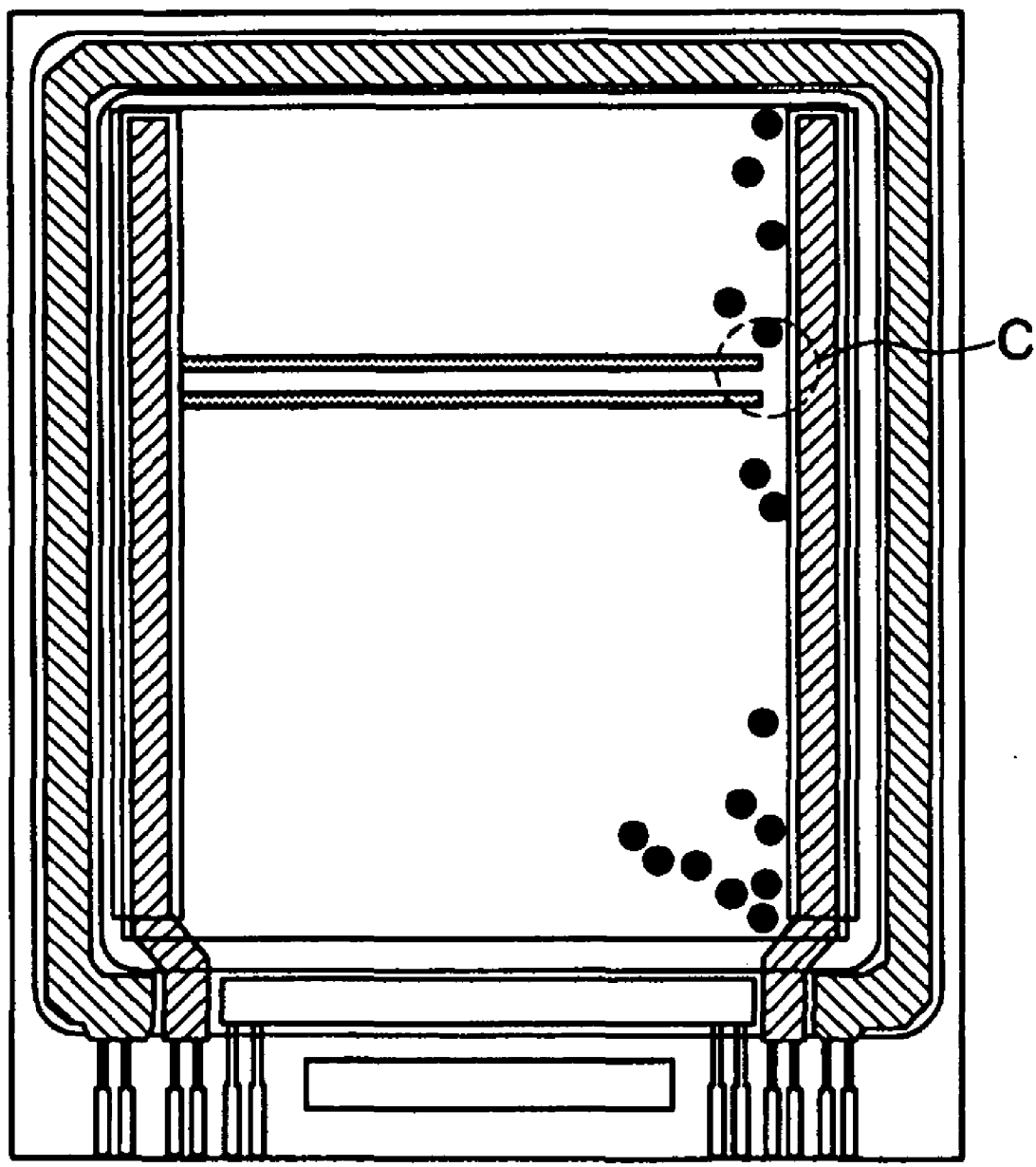
FIG. 4 is a drawing illustrating a defect map of the organic electroluminescence display device of FIG. 3A.

The present invention will now be described in detail in connection with examples of embodiments with reference to the accompanying drawings. For reference, like reference characters designate like elements throughout the drawings.

Figure 5:
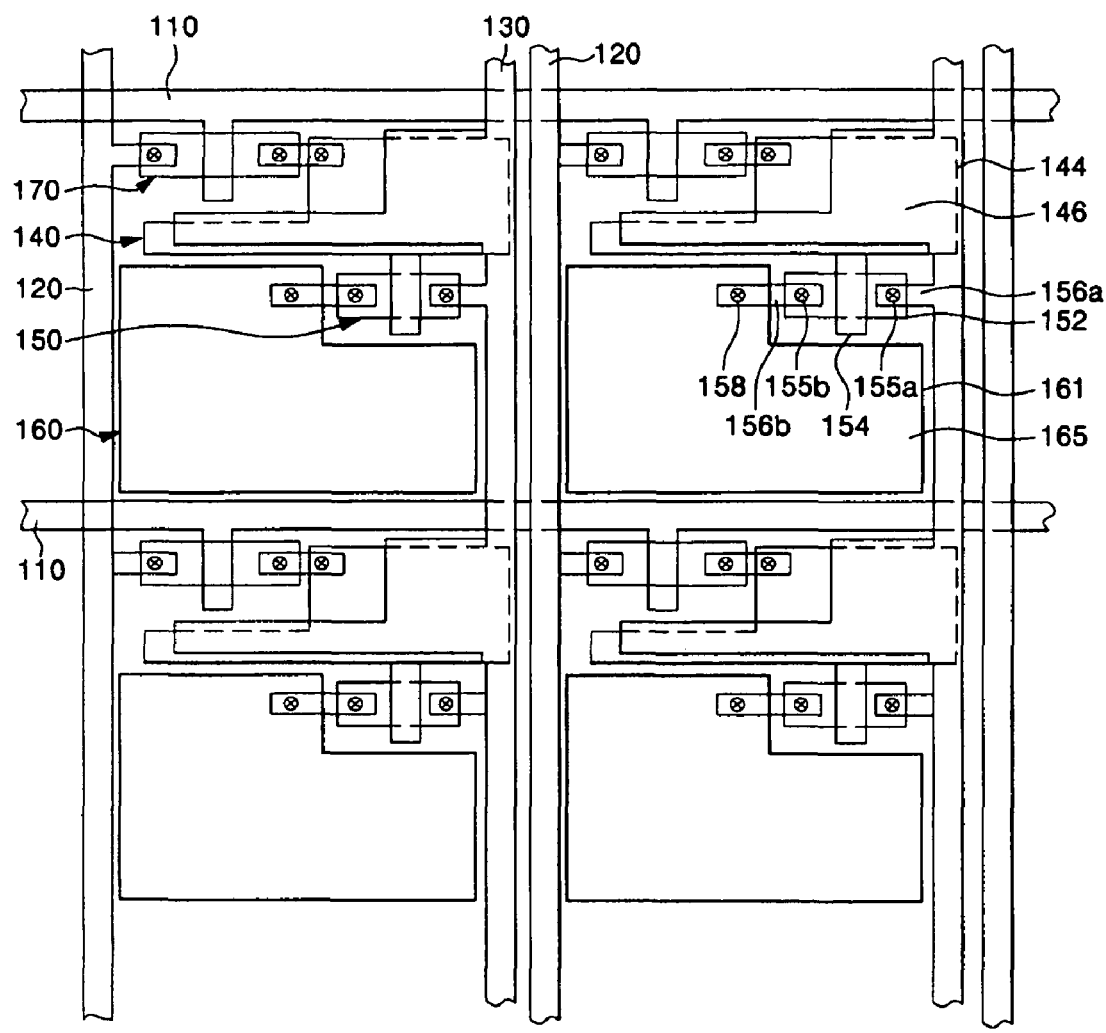
FIG. 5 is a plan view of one embodiment of an organic electroluminescence display device according to the present invention.
Figure 6:
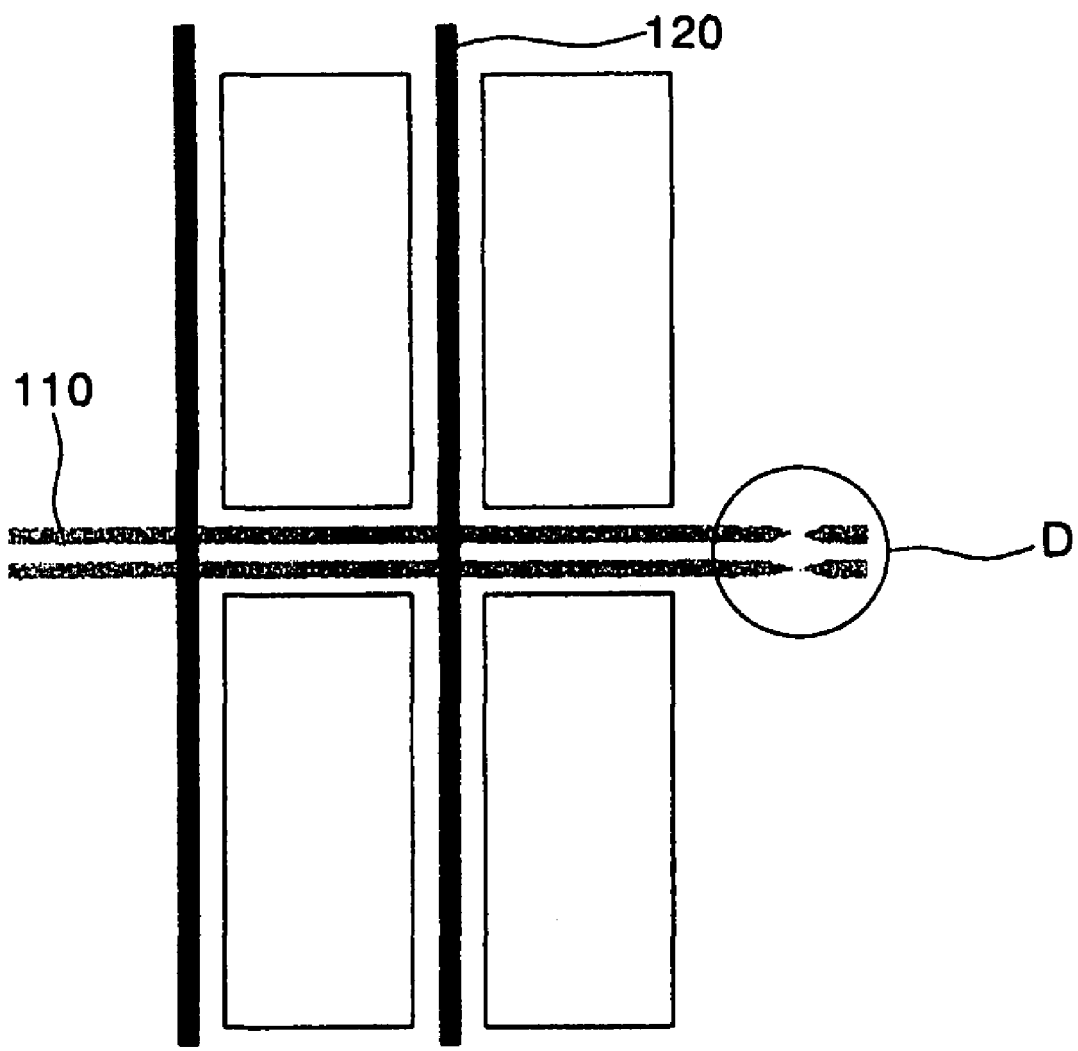
FIG. 6 is a schematic plan view illustrating a portion of an organic electroluminescence display device according to the present invention.

FIG. 5 is a plan view of one embodiment of an organic electroluminescence display device according to the present invention, and FIG. 6 is a schematic plan view illustrating a part of an organic electroluminescence display device according to the present invention.

Referring to FIG. 5, an active matrix organic electroluminescence display device includes a plurality of scan lines 110, a plurality of data lines 120, a plurality of power supply lines 130, and a plurality of pixels connected to the scan lines 110, the data lines 120, and the power supply lines 130.

Each of the pixels includes a switching thin film transistor 170 connected to one corresponding scan line 110 in the plurality of scan lines 110 and one corresponding data line in the plurality of data lines 120; an electroluminescence device 160, a driving thin film transistor 150 for the organic electroluminescence device 160 connected to the power supply lines; and a capacitor 140 for maintaining voltage between gate and source of the driving thin film transistor 150. The electroluminescence device 160 includes an organic layer and at least a light-emitting layer.

The driving thin film transistor 150 includes a semiconductor layer 152 equipped with source and drain regions, a gate electrode 154, and source and drain electrodes 156a, 156b respectively connected to the source and drain regions through contact holes 155a, 155b. The switching thin film transistor 170 has the same structure as the driving thin film transistor 150.

The capacitor 140 includes a lower electrode 144 connected to the source electrode or the drain electrode of the switching thin film transistor 170, e.g., the source electrode, and the gate of the driving thin film transistor 150. The capacitor 140 also includes an upper electrode 146 connected to the drain electrode or the source electrode of the driving thin film transistor 150, e.g., the source electrode 156a, and a common power supply line 130. Pixel electrodes 161 that are anodes of the electroluminescence device 160 are equipped with an opening part 165 and connected to one of the source or drain electrodes 156a, 156b of the driving thin film transistor 150, e.g., drain electrode 156b, through a via hole 158.

The scan lines 110 are connected to the gate electrode of the switching thin film transistor 170, and the scan lines 110 and the gate electrode are formed at the same time.

Referring to FIG. 6, a schematic plan view illustrates a part of an organic electroluminescence display device. Scan lines 110 and data lines 120 surround pixels, and a unit for protecting the organic electroluminescence display device during generation of static electricity is formed on a part D marked at one end of the scan lines 110. An electrostatic discharge prevention unit installed on the part D at one end of the scan lines 110 is constructed by adjusting a width of the scan lines 110. In one embodiment, the electrostatic discharge prevention unit is in electrostatic discharge during generation of static electricity. The electrostatic discharge prevention unit is formed in an hourglass shape such that two cusps face each other, and the electrostatic discharge prevention unit is thinner than gate insulation film of a thin film transistor (not shown).

Figure 7A:
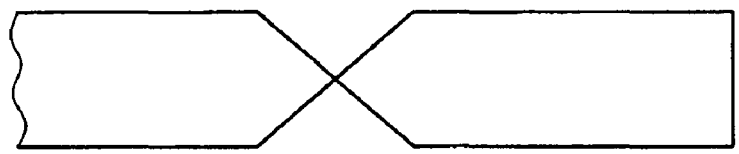
FIG. 7A is a plan view of a first embodiment of an electrostatic discharge prevention unit according to the present invention.
Figure 7B:
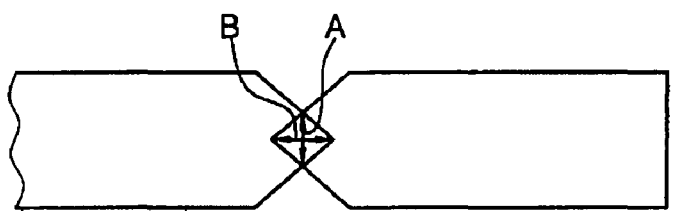
FIG. 7B is a plan view of a second embodiment of an electrostatic discharge prevention unit according to the present invention.
Figure 7C:
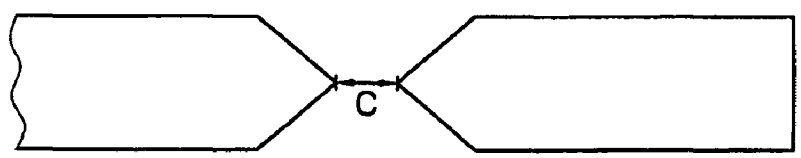
FIG. 7C is a plan view of a third embodiment of an electrostatic discharge prevention unit according to the present invention.
Figure 8A:
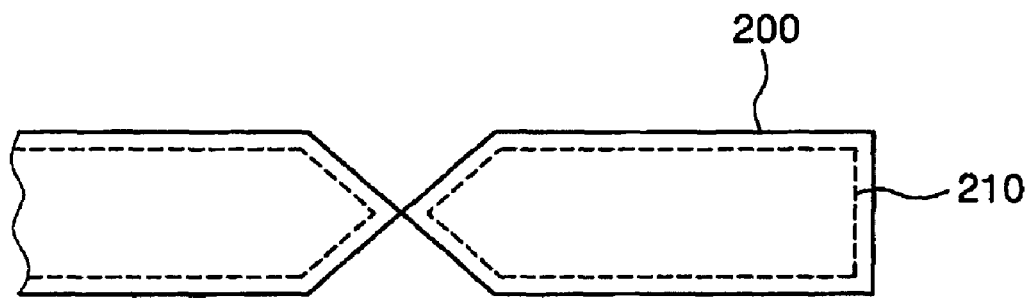
FIG. 8A to FIG. 8B are plan views illustrating a mask for an electrostatic discharge prevention unit according to the present invention.
Figure 8B:
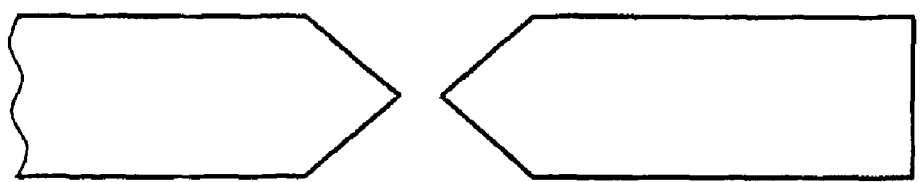

FIG. 7A to FIG. 7C are partial plan views illustrating various embodiments of an electrostatic discharge prevention unit according to the present invention. FIG. 8A and FIG. 8B are mask patterns for forming the electrostatic discharge prevention units of FIG. 7A to FIG. 7C.

Referring to FIGS. 7A to 7C, an electrostatic discharge prevention unit is formed on one end of the scan lines during patterning of gate electrodes of thin film transistor and scan lines. The electrostatic discharge prevention unit can be formed in an hourglass shape in which the two cusps are in contact with each other as illustrated in FIG. 7A or in a shape in which the cusps are overlapped with each other as illustrated in FIG. 7B. Furthermore, the electrostatic discharge prevention unit can be formed in a shape in which the cusps are spaced apart from each other as illustrated in FIG. 7C. An overlapped distance B or a spaced distance C of the cusps are determined within a range of 2,000 Å (0.2 µm), and in these embodiments the scan lines are thinner than a thickness of a gate insulation film. In one embodiment, a width A (shown in FIG. 7B) of an electrostatic discharge prevention unit formed by overlapping the cusps is thinner than a thickness of the gate insulation film of the thin film transistors. For example, when a semiconductor layer under the gate insulation film is formed as a low temperature polycrystalline silicon layer, the low temperature polycrystalline silicon layer is formed such that the surface of the semiconductor layer is roughened by a grain boundary. Accordingly, thickness of a gate insulation film formed on an upper part of the semiconductor layer is uneven. To prevent a device from being damaged by static electricity, therefore, a width of the electrostatic discharge prevention unit is made thinner than the thickness of the gate insulation film thinly formed.

The electrostatic discharge prevention unit can be formed by the following method.

Since the electrostatic discharge prevention unit is formed when forming a gate electrode, after forming a gate electrode material, a mask pattern is formed by performing exposure and developing an upper part of the gate electrode material using a mask for forming the gate electrode and the electrostatic discharge prevention unit.

Next, the gate electrode material is etched using the mask pattern as an etching mask to form gate electrodes on a thin film transistor region and scan lines electrically connected to the gate electrodes at the same time. The electrostatic discharge prevention unit is formed on one end of the scan lines.

Referring to FIG. 8A, a photosensitive film pattern 200 for forming an electrostatic discharge prevention unit is represented as a solid line, and the electrostatic discharge prevention unit 210 formed after etching is represented as a dotted line. An electrostatic discharge prevention unit in which two cusps are connected to each other is formed by over-etching the gate electrode material using the photosensitive film pattern 200 as an etching mask. Furthermore, two cusps can be overlapped with each other or spaced apart from each other based on the extent of the etching.

Referring to FIG. 8B, a photosensitive film pattern in which two cusps are connected to each other by diffraction can be formed by performing an exposure process using the exposure mask after spacing a mask pattern as an exposure mask at a fixed distance. An electrostatic discharge prevention unit in which two cusps are connected to each other can be formed using the photosensitive film pattern as an etching mask. A distance between patterns of the exposure mask varies according to exposure conditions.

Examples of embodiments of a flat panel display device and a fabrication method thereof discussed above do not require an increased area, since an existing layout is used as it is, but prevent damage to the device by static electricity generated in pixels by partially changing the shape of mask patterns, thereby forming an electrostatic discharge prevention unit. The process yield of the flat panel display device is improved accordingly.

While the invention has been particularly shown and described with reference to examples of embodiments thereof, it will be understood by those skilled in the art that the foregoing and other changes in form and details may be made therein without departing from the spirit and scope of the invention as set forth in the appended claims and equivalents thereof.

What is claimed is:

1. A flat panel display device comprising:
    a plurality of data lines extending in a first direction and spaced apart from one another on a substrate;
    a plurality of power supply lines extending in the first direction and spaced apart from one another;
    a plurality of scan lines extending in a second direction perpendicular to the first direction to cross the data line and the power supply line, the scan line being spaced apart from one another;
    at least two thin film transistors each on the substrate and including a semiconductor layer, a gate insulation film, a gate electrode, a source electrode, and a drain electrode;
    at least one capacitor having a first electrode and a second electrode, the first electrode connected to the source electrode or the drain electrode of one of the thin film transistors;
    an organic layer comprising at least one light-emitting layer coupled to one of the thin film transistors; and
    an electrostatic discharge prevention unit positioned at a terminal portion of at least one of the plurality of scan lines,
    wherein the electrostatic discharge prevention unit comprises cusps that are in contact with each other.

2. The flat panel display device according to claim 1, wherein at least one of the film transistors is a switching transistor.

3. The flat panel display device according to claim 1, wherein at least one of the thin film transistors is a driving transistor.

4. The flat panel display device according to claim 2, wherein the gate electrode of the at least one thin film transistor is connected to one of the scan lines.

5. The flat panel display device according to claim 3, wherein the at least one thin film transistor is connected to one of the power supply lines.

6. The flat panel display device according to claim 3, wherein the gate electrode of the at least one thin film transistor is connected to the first electrode of the capacitor.

7. The flat panel display device according to claim 3, wherein the at least one thin film transistor is connected to the second electrode of the capacitor.

8. The flat panel display device according to claim 1, wherein at least one of the semiconductor layers of the thin film transistors comprises a low temperature polycrystalline silicon layer.

9. The flat panel display device according to claim 1, wherein the cusps overlap each other by approximately 0.2 µm.

10. The flat panel display device according to claim 1, wherein the cusps cross each other at a crossed region, and a width of a part at the crossed region is thinner than at least one of the gate insulation films of the thin film transistors.

11. The flat panel display device according to claim 1:
    wherein at least one of the scan lines comprises an elongated rectangular trace having at least two terminal portions; and
    wherein the electrostatic discharge unit is positioned at one of the at least two terminal portions of the elongated rectangular trace.

12. The flat panel display device according to claim 1:
    wherein the cusps comprise a first cusp having a first point and a second cusp having a second point; and
    wherein the first point is in physical contact with the second point.

* * * * *